(12) United States Patent
Satou

(10) Patent No.: US 10,566,934 B2
(45) Date of Patent: Feb. 18, 2020

(54) POWER AMPLIFIER CIRCUIT

(71) Applicant: Murata Manufacturing Co., Ltd., Kyoto (JP)

(72) Inventor: Hideyuki Satou, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/220,477

(22) Filed: Dec. 14, 2018

(65) Prior Publication Data

US 2019/0190457 A1 Jun. 20, 2019

(30) Foreign Application Priority Data

Dec. 19, 2017 (JP) ................................ 2017-243170

(51) Int. Cl.
*H03F 1/02* (2006.01)
*H03F 3/19* (2006.01)
*H03F 3/24* (2006.01)
*H03G 3/30* (2006.01)

(52) U.S. Cl.
CPC ............ *H03F 1/0222* (2013.01); *H03F 3/19* (2013.01); *H03F 3/245* (2013.01); *H03F 2200/451* (2013.01); *H03G 3/3042* (2013.01)

(58) Field of Classification Search
CPC .................................................. H03F 1/0222
See application file for complete search history.

(56) References Cited

U.S. PATENT DOCUMENTS

| 9,917,549 B1* | 3/2018 | Allen ........................ H03F 3/19 |
| 2002/0005760 A1* | 1/2002 | Masahiro ............. H03G 1/0082 330/284 |
| 2009/0309663 A1* | 12/2009 | Griffiths ................ H03F 1/0272 330/296 |
| 2011/0006846 A1 | 1/2011 | Miho et al. |
| 2011/0043287 A1* | 2/2011 | Chen ..................... H03F 1/0266 330/296 |
| 2012/0235750 A1* | 9/2012 | Granger-Jones ........ H03F 1/302 330/296 |
| 2014/0253243 A1 | 9/2014 | Hagisawa et al. |
| 2014/0285268 A1* | 9/2014 | Tsutsui ..................... H03F 1/32 330/296 |
| 2018/0375474 A1* | 12/2018 | Namie .................. H03F 1/0211 |

FOREIGN PATENT DOCUMENTS

JP 2014-171170 A 9/2014
WO 2009-125555 A1 10/2009

* cited by examiner

*Primary Examiner* — Patricia T Nguyen
(74) *Attorney, Agent, or Firm* — Pearne & Gordon LLP

(57) ABSTRACT

A power amplifier circuit includes a first transistor having a base supplied with an RF signal and a collector supplied with a variable power supply voltage corresponding to a level of the RF signal, the first transistor being configured to amplify the RF signal, a bias circuit including a second transistor that supplies a bias current to the base of the first transistor, and a bias adjustment circuit that decreases a current to be supplied from an emitter of the second transistor as the variable power supply voltage decreases, thereby decreasing the bias current to be supplied to the base of the first transistor.

8 Claims, 7 Drawing Sheets

POWER AMPLIFIER CIRCUIT

This application claims priority from Japanese Patent Application No. 2017-243170 filed on Dec. 19, 2017. The content of this application is incorporated herein by reference in its entirety.

BACKGROUND

The present disclosure relates to a power amplifier circuit. A mobile communication terminal such as a cellular phone includes a power amplifier circuit that amplifies a radio frequency (RF) signal to be transmitted to a base station. The power amplifier circuit includes a transistor that amplifies an RF signal, and a bias circuit that supplies a bias current to the transistor. For example, as described in Japanese Unexamined Patent Application Publication No. 2014-171170, a known power amplifier module includes, as a bias circuit of the type described above, an emitter follower transistor that supplies a bias current to the transistor, and a constant voltage generation circuit that generates a constant voltage to be supplied to the collector of the emitter follower transistor.

A known technique for improving the efficiency of a power amplifier circuit is envelope tracking (ET) control for controlling a power supply voltage in accordance with the level of an RF signal. In ET control, the value of a power supply voltage is controlled in accordance with the level of an RF signal to increase efficiency such as power-added efficiency (PAE). In this case, a larger change in gain (gain dispersion) relative to a change in a power supply voltage to be supplied to a transistor enables the use of a higher efficiency power supply voltage value while keeping gain flatness. In ET control, therefore, the greater the gain dispersion of a power amplifier circuit, the more preferable.

BRIEF SUMMARY

Accordingly, the present disclosure provides a power amplifier circuit with the gain dispersion broadened in accordance with a change in power supply voltage.

According to embodiments of the present disclosure, a power amplifier circuit includes a first transistor having a base supplied with a radio frequency (RF) signal and a collector supplied with a variable power supply voltage corresponding to a level of the RF signal, the first transistor being configured to amplify the RF signal, a bias circuit including a second transistor that supplies a bias current to the base of the first transistor, and a bias adjustment circuit that decreases a current to be supplied from an emitter of the second transistor as the variable power supply voltage decreases, thereby decreasing the bias current to be supplied to the base of the first transistor.

According to embodiments of the present disclosure, it is possible to provide a power amplifier circuit with the gain dispersion broadened in accordance with a change in power supply voltage.

Other features, elements, characteristics and advantages of the present disclosure will become more apparent from the following detailed description of embodiments of the present disclosure with reference to the attached drawings.

DETAILED DESCRIPTION

Figure 1:
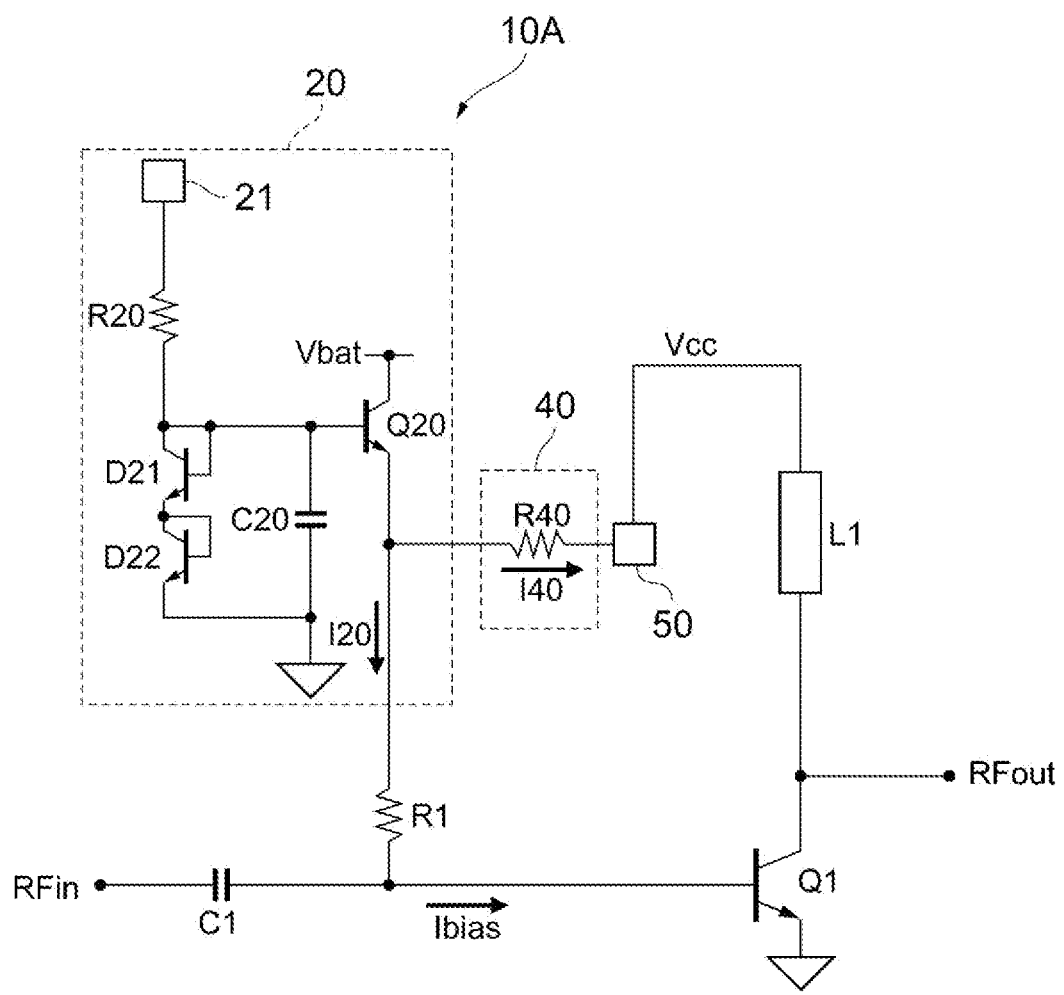
FIG. 1 is a circuit diagram of a power amplifier circuit according to a first embodiment of the present disclosure.

Embodiments of the present disclosure will be described with reference to the accompanying drawings. In the drawings, components having the same numerals or symbols have the same or similar configuration.

First Embodiment

FIG. 1 is a circuit diagram of a power amplifier circuit 10A according to a first embodiment of the present disclosure. The power amplifier circuit 10A is included in a mobile communication terminal such as a cellular phone and is configured to amplify the power of an input signal RFin to a level necessary to transmit the input signal RFin to a base station to produce an amplified signal and to output the amplified signal as an output signal RFout. The input signal RFin is, for example, an RF signal modulated by a radio frequency integrated circuit (RFIC) or the like in accordance with a predetermined communication scheme.

The power amplifier circuit 10A includes a transistor Q1 (first transistor), a first bias circuit 20, a bias adjustment circuit 40, a choke inductor L1, a capacitance element C1, and a resistance element R1. The transistor Q1 is a heterojunction bipolar transistor, for example. The transistor Q1 forms a common-emitter amplifier with the emitter connected to ground. The input signal RFin is provided to the base of the transistor Q1 via the capacitance element C1, and the output signal RFout is output from the collector of the transistor Q1. The collector of the transistor Q1 is connected to a terminal 50 to which a variable power supply voltage Vcc is supplied via the choke inductor L1. The choke inductor L1 is configured to prevent the RF signal from leaking to the power supply side. The terminal 50 is connected to the variable power supply voltage Vcc, which is not illustrated in FIG. 1. The variable power supply voltage Vcc is a voltage corresponding to the level of the RF signal. That is, envelope tracking (ET) control is performed in the power amplifier circuit 10A. The variable power supply voltage Vcc is supplied from, for example, an ET power supply circuit (not illustrated).

The first bias circuit 20 supplies a first bias current I20 to the base of the transistor Q1 via the resistance element R1. The first bias circuit 20 includes a transistor Q20 (second transistor) and diodes D21 and D22. A power supply voltage Vbat is supplied to the collector of the transistor Q20. The base of the transistor Q20 is connected to the anode of the diode D21 and is also connected to ground via a capacitance element C20. The emitter of the transistor Q20 is connected to the base of the transistor Q1 via the resistance element R1. The anode of the diode D21 is connected to a power supply terminal 21 via a resistance element R20. The power supply terminal 21 is supplied with a bias control voltage or a bias control current from a control IC or the like. The anode of the diode D22 is connected to the cathode of the diode D21. The cathode of the diode D22 is connected to ground. The diodes D21 and D22 are, for example, diode-connected bipolar transistors. However, the diodes D21 and D22 are not limited to diode-connected bipolar transistors and may be PN junction diodes, for example.

The bias adjustment circuit 40 adjusts a bias current Ibias, which is the first bias current I20 to be supplied to the base of the transistor Q1, in accordance with the variable power supply voltage Vcc. Specifically, the bias adjustment circuit 40 decreases the first bias current I20 to be supplied from the emitter of the transistor Q20 as the variable power supply voltage Vcc decreases, thereby decreasing the bias current Ibias to be supplied to the base of the transistor Q1. The bias adjustment circuit 40 includes a resistance element R40. The resistance element R40 has an end connected to the emitter of the transistor Q20. The resistance element R40 has another end connected to the variable power supply voltage Vcc via the terminal 50. Thus, the other end of the resistance element R40 is supplied with a voltage corresponding to the variable power supply voltage Vcc. An adjusted current I40, which is a portion of the current supplied from the emitter of the transistor Q20, flows through the resistance element R40. The other end of the resistance element R40 may not necessarily be connected to the terminal 50 as long as a voltage corresponding to the variable power supply voltage Vcc is supplied to the other end of the resistance element R40, and may be connected to, for example, the collector of the transistor Q1 via a low pass filter circuit or the like.

The operation of the power amplifier circuit 10A will now be described. As the variable power supply voltage Vcc decreases, the voltage at the other end of the resistance element R40 decreases via the terminal 50 and the adjusted current I40 increases. Then, the first bias current I20 decreases, resulting in a decrease in the bias current Ibias to be supplied to the base of the transistor Q1. Thus, the gain of the transistor Q1 decreases.

Figure 2:
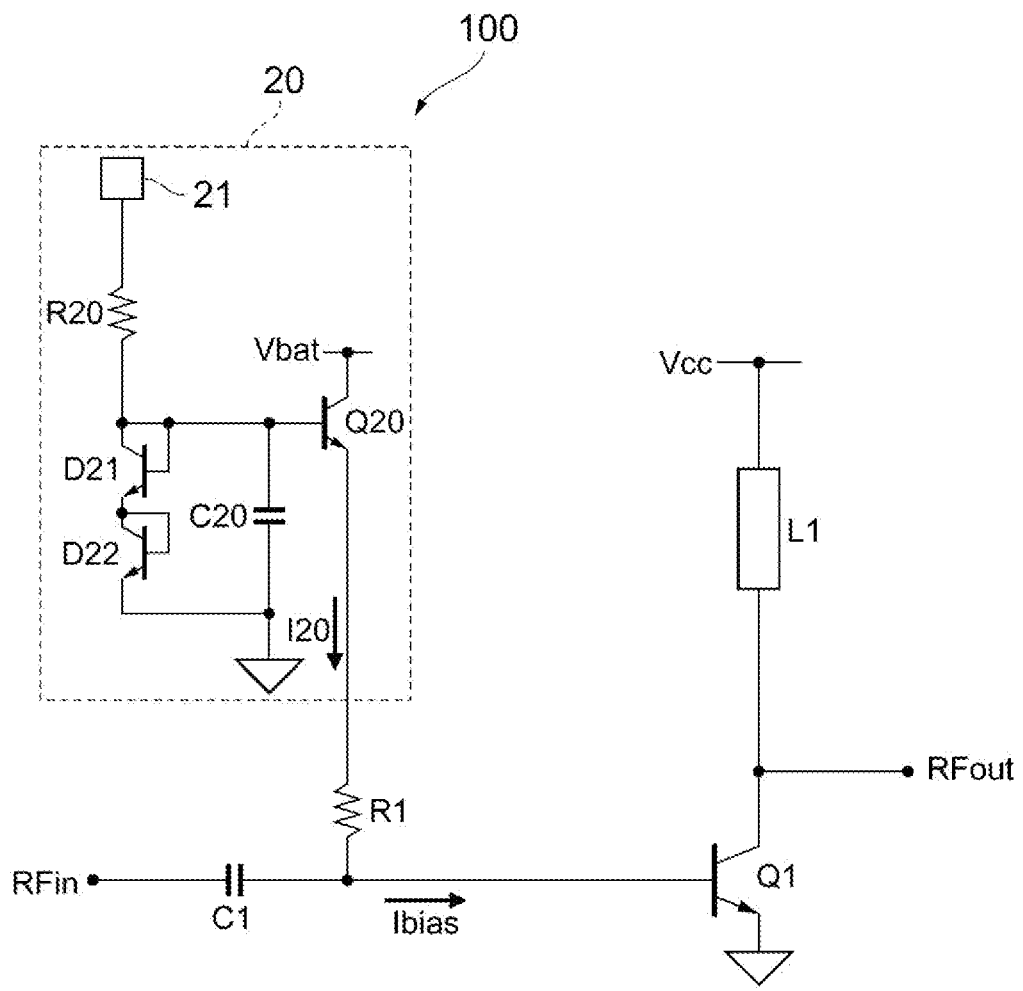
FIG. 2 is a circuit diagram of a power amplifier circuit of a comparative example.

FIG. 2 is a circuit diagram of a power amplifier circuit 100 of a comparative example. Unlike the power amplifier circuit 10A according to the first embodiment, the power amplifier circuit 100 of the comparative example does not include the bias adjustment circuit 40. Since the power amplifier circuit 100 of the comparative example does not include the bias adjustment circuit 40, the bias current Ibias to be supplied to the base of the transistor Q1 is not adjusted in accordance with the variable power supply voltage Vcc.

Figure 3:
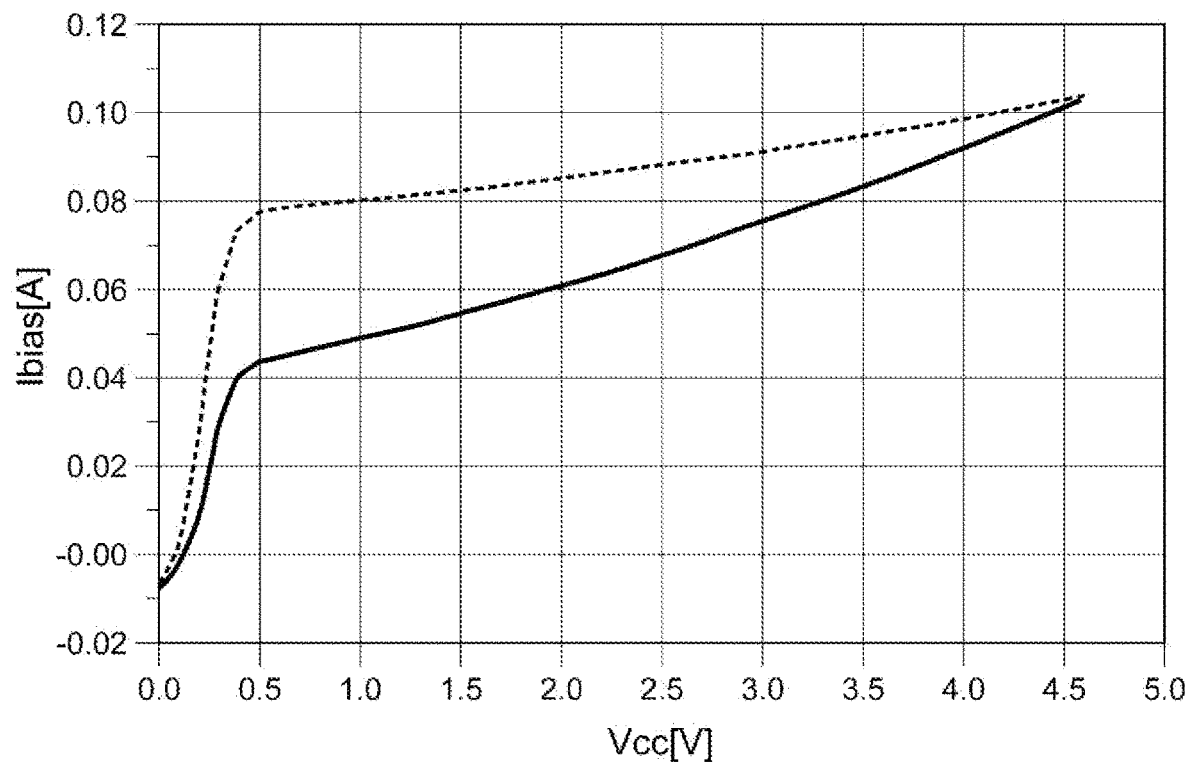
FIG. 3 illustrates simulation results of a bias current.
Figure 3:
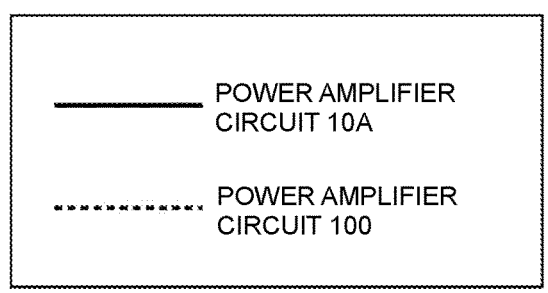

FIG. 3 illustrates simulation results of the bias current Ibias. In FIG. 3, the horizontal axis represents the variable power supply voltage Vcc (V), and the vertical axis represents the bias current Ibias (A). In FIG. 3, the solid line indicates the simulation results of the bias current Ibias in the power amplifier circuit 10A according to the first embodiment, and the broken line indicates the simulation results of the bias current Ibias in the power amplifier circuit 100 of the comparative example.

As illustrated in FIG. 3, in the power amplifier circuit 100 of the comparative example, it is found that the decrease in the bias current Ibias is small until the variable power supply voltage Vcc decreases to about 0.4 V. The reason for this is considered to be that since the power amplifier circuit 100 of the comparative example does not include the bias adjustment circuit 40, the bias current Ibias decreases at a substantially constant rate in accordance with a decrease in the variable power supply voltage Vcc. In the power amplifier circuit 10A according to the first embodiment, in contrast, as illustrated in FIG. 3, it is found that the decrease in the bias current Ibias is larger than that in the power amplifier circuit 100 of the comparative example as the variable power supply voltage Vcc decreases from approximately 4.5 V to approximately 0.4 V. The reason for this is considered to be that, as described above, the adjusted current I40 flowing in the resistance element R40 increases as the variable power supply voltage Vcc decreases, and thus the bias current Ibias to be supplied to the base of the transistor Q1 relatively decreases. Accordingly, it may be said that the power amplifier circuit 10A according to the first embodiment generates a larger decrease in the bias current Ibias with a decrease in the variable power supply voltage Vcc than the power amplifier circuit 100 of the comparative example.

Figure 4A:
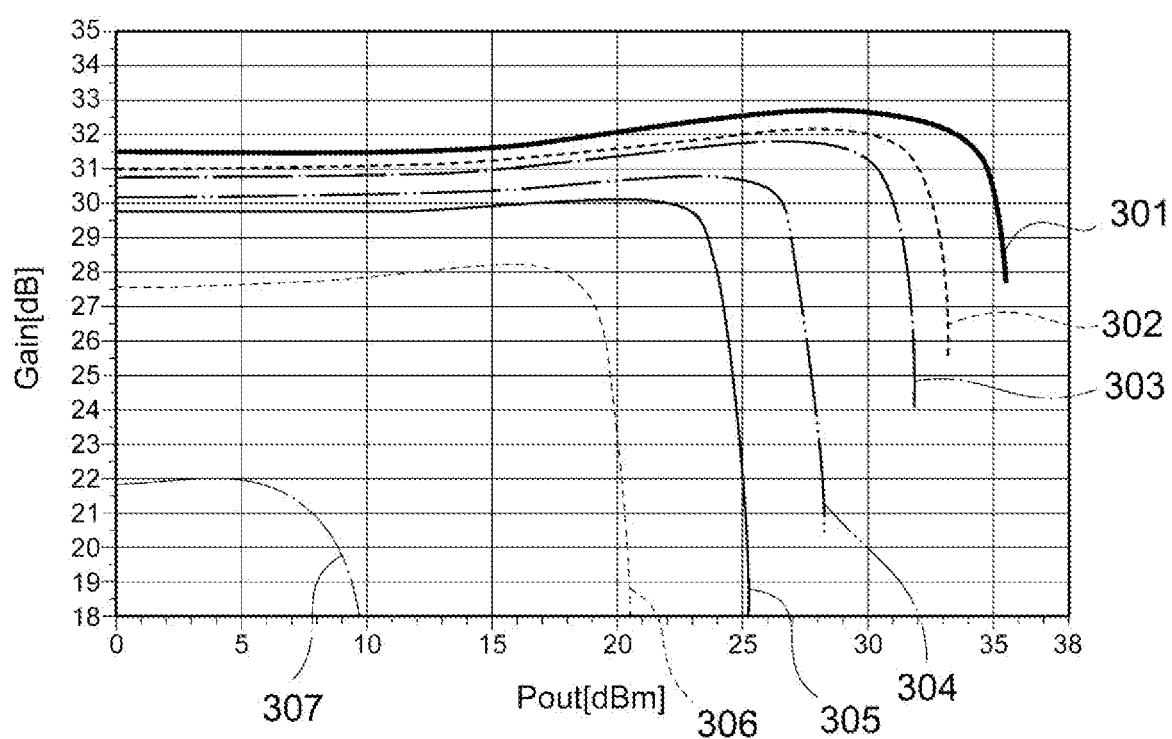
FIG. 4A illustrates relationships between the output power and the gain of the power amplifier circuit according to the first embodiment.
Figure 4B:
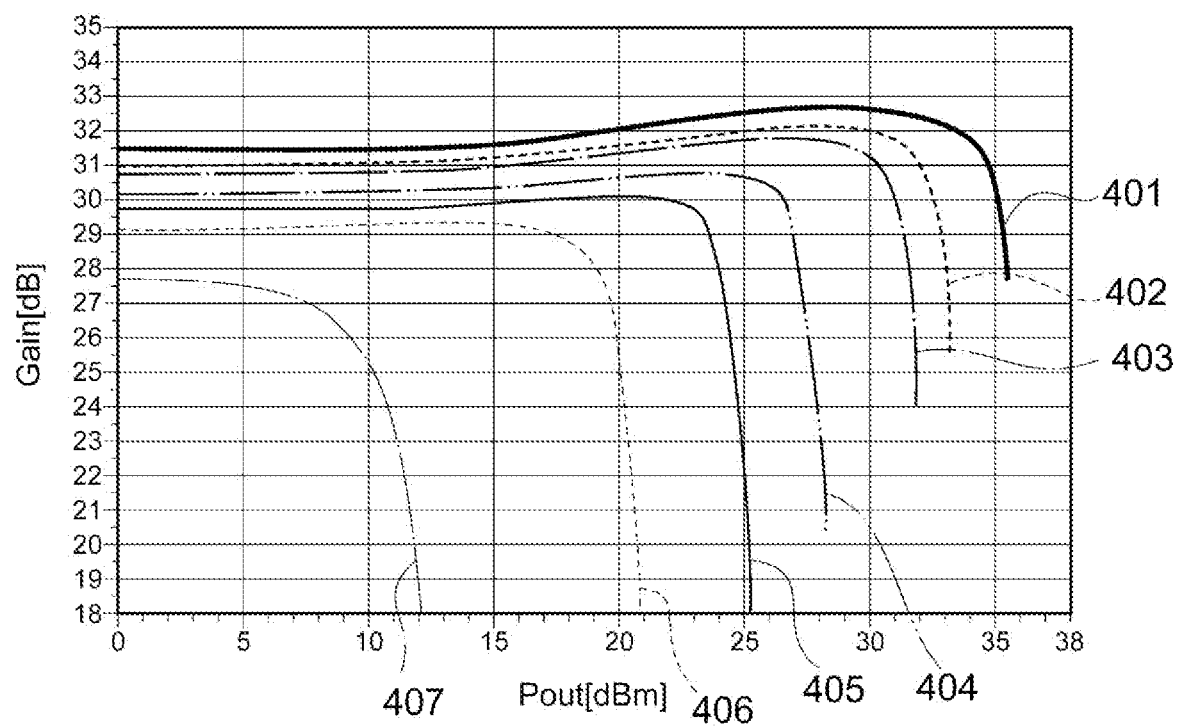
FIG. 4B illustrates relationships between the output power and the gain of the power amplifier circuit of the comparative example.

FIG. 4A illustrates relationships between the output power and the gain of the power amplifier circuit 10A according to the first embodiment, and FIG. 4B illustrates relationships between the output power and the gain of the power amplifier circuit 100 of the comparative example. In FIGS. 4A and 4B, the horizontal axis represents the output power Pout (dBm), and the vertical axis represents the gain (dB). In FIG. 4A, plots 301, 302, 303, 304, 305, 306, and 307 indicate relationships between the output power and the gain when the variable power supply voltage Vcc is set to 4.5 V, 3.5 V, 3.0 V, 2.0 V, 1.5 V, 1.0 V, and 0.5 V, respectively. In FIG. 4B, plots 401, 402, 403, 404, 405, 406, and 407 indicate relationships between the output power and the gain when the variable power supply voltage Vcc is set to 4.5 V, 3.5 V, 3.0 V, 2.0 V, 1.5 V, 1.0 V, and 0.5 V, respectively.

As illustrated in FIG. 4A, at an output power of about 0 dBm, the power amplifier circuit 10A has a gain of approximately 31.4 dB when the variable power supply voltage Vcc is set to 4.5 V, as indicated by the plot 301, and a gain of approximately 21.9 dB when the variable power supply voltage Vcc is set to 0.5 V, as indicated by the plot 307. Thus, at an output power of about 0 dBm, the change in the gain of the power amplifier circuit 10A when the variable power supply voltage Vcc changes from 4.5 V to 0.5 V is approximately 9.5 dB (31.4 dB-21.9 dB). As illustrated in FIG. 4B, at an output power of about 0 dBm, the power amplifier circuit 100 has a gain of approximately 31.4 dB when the variable power supply voltage Vcc is set to 4.5 V, as indicated by the plot 401, and a gain of approximately 27.7 dB when the variable power supply voltage Vcc is set to 0.5 V, as indicated by the plot 407. Thus, at an output power of about 0 dBm, the change in the gain of the power amplifier circuit 100 when the variable power supply voltage Vcc changes from 4.5 V to 0.5 V is approximately 3.7 dB (31.4 dB-27.7 dB). Accordingly, the change in gain relative to a change in the variable power supply voltage Vcc in the power amplifier circuit 10A is greater than the change in gain relative to a change in the variable power supply voltage Vcc in the power amplifier circuit 100. That is, it may be said that the gain dispersion of the power amplifier circuit 10A is broadened compared to that of the power amplifier circuit 100.

Second Embodiment

Figure 5:
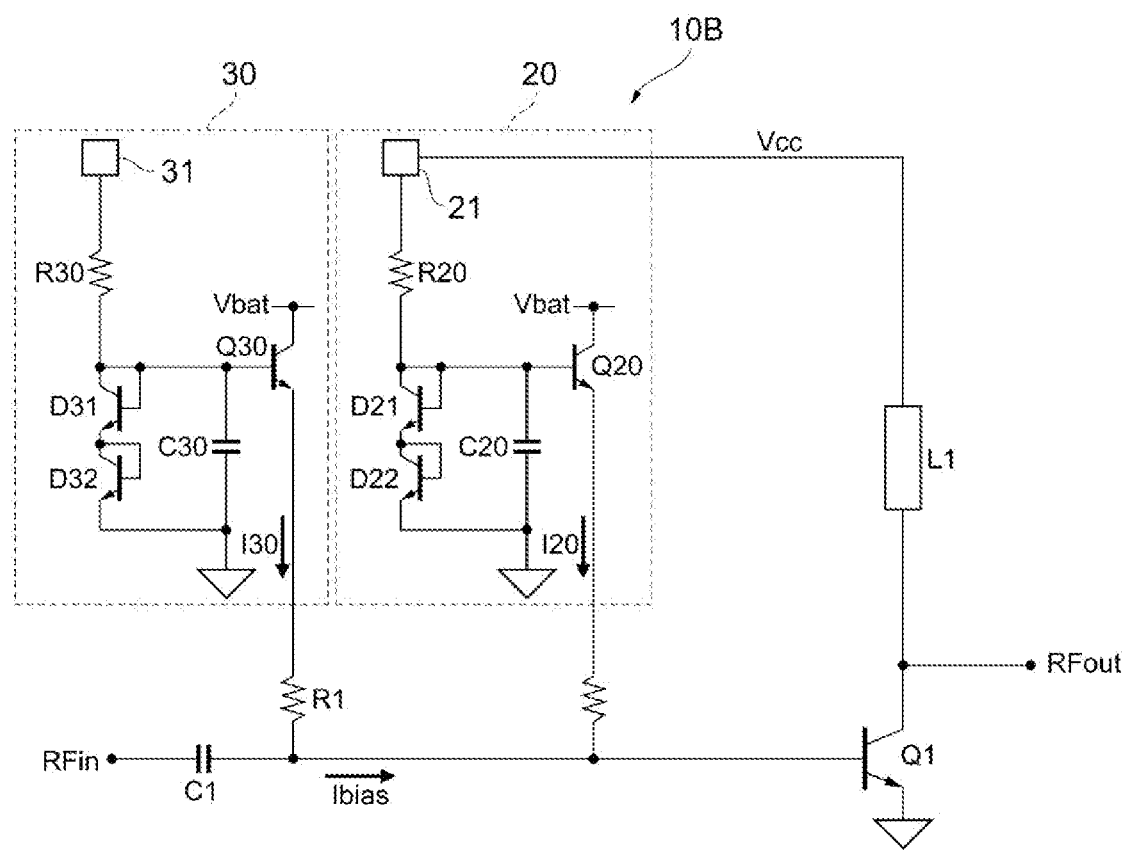
FIG. 5 is a circuit diagram of a power amplifier circuit according to a second embodiment of the present disclosure.

FIG. 5 is a circuit diagram of a power amplifier circuit 10B according to a second embodiment of the present disclosure. In the following, portions of the power amplifier circuit 10B different from those of the power amplifier circuit 10A will be described, whereas the same or substantially the same portions as those of the power amplifier circuit 10A will not be described, if not necessary.

The power amplifier circuit 10B does not include the bias adjustment circuit 40, unlike the power amplifier circuit 10A. In addition, the power amplifier circuit 10B further includes a second bias circuit 30. Further, the power supply terminal 21 included in the first bias circuit 20 in the power amplifier circuit 10B is supplied with a voltage corresponding to the variable power supply voltage Vcc.

The second bias circuit 30 supplies a second bias current I30 to the base of the transistor Q1 via the resistance element R1. The second bias circuit 30 includes a transistor Q30 (third transistor) and diodes D31 and D32. The collector of the transistor Q30 is supplied with the power supply voltage Vbat. The base of the transistor Q30 is connected to the anode of the diode D31 and is also connected to ground via a capacitance element C30. The emitter of the transistor Q30 is connected to the base of the transistor Q1 via the resistance element R1. The anode of the diode D31 is connected to a power supply terminal 31 via a resistance element R30. The power supply terminal 31 is supplied with a bias control voltage or a bias control current from a control IC or the like. The anode of the diode D32 is connected to the cathode of the diode D31. The cathode of the diode D32 is connected to ground. The diodes D31 and D32 are, for example, diode-connected bipolar transistors. However, the diodes D31 and D32 are not limited to diode-connected bipolar transistors and may be PN junction diodes, for example.

The operation of the power amplifier circuit 10B will now be described. When the variable power supply voltage Vcc is in a range greater than or equal to a voltage necessary to turn on the transistor Q20, the voltage at the base of the transistor Q20 decreases via the power supply terminal 21 as the variable power supply voltage Vcc decreases. Then, the first bias current I20 decreases, resulting in a decrease in the bias current Ibias to be supplied to the base of the transistor Q1, which is a current obtained by adding together the first bias current I20 and the second bias current I30. Thus, the gain of the transistor Q1 decreases. When the variable power supply voltage Vcc is in a range less than the voltage necessary to turn on the transistor Q20, the transistor Q20 remains in the off state, and the first bias current I20 is 0.

Figure 6:
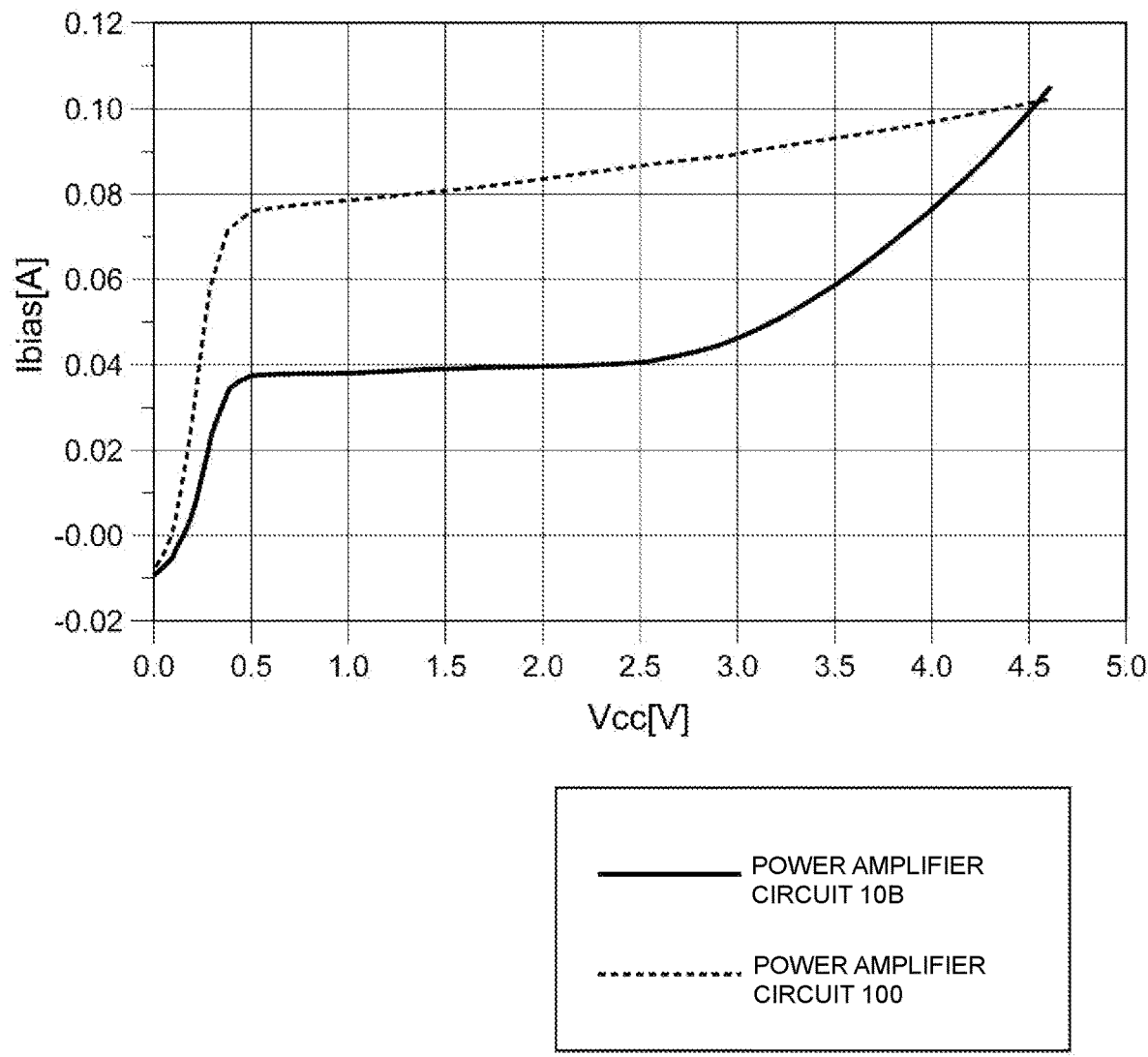
FIG. 6 illustrates simulation results of another bias current.

FIG. 6 illustrates simulation results of another bias current Ibias. In FIG. 6, the horizontal axis represents the variable power supply voltage Vcc (V), and the vertical axis represents the bias current Ibias (A). In FIG. 6, the solid line indicates the simulation results of the bias current Ibias in the power amplifier circuit 10B according to the second embodiment, and the broken line indicates the simulation results of the bias current Ibias in the power amplifier circuit 100 of the comparative example.

As illustrated in FIG. 6, in the power amplifier circuit 100 of the comparative example, it is found that the bias current Ibias decreases at a substantially constant rate such that the decrease in the bias current Ibias is comparatively small until the variable power supply voltage Vcc decreases to about 0.4 V. In the power amplifier circuit 10B according to the second embodiment, in contrast, as illustrated in FIG. 6, it is found that the decrease in the bias current Ibias is larger than that in the power amplifier circuit 100 of the comparative example as the variable power supply voltage Vcc decreases from approximately 4.5 V to approximately 2.5 V. The reason for this is considered to be that, as described above, as the variable power supply voltage Vcc decreases, the voltage at the base of the transistor Q20 decreases and the first bias current I20 decreases, resulting in a decrease in the bias current Ibias to be supplied to the base of the transistor Q1. In addition, as illustrated in FIG. 6, as the variable power supply voltage Vcc further decreases from approximately 2.5 V, the decrease in the bias current Ibias is significantly small. The reason for this is considered to be that since the transistor Q20 remains in the off state when the variable power supply voltage Vcc is in a range less than approximately 2.5 V, the change in the first bias current I20 does not contribute to the change in the bias current Ibias. Accordingly, it may be said that the power amplifier circuit 10B according to the second embodiment generates a larger decrease in the bias current Ibias with a decrease in the variable power supply voltage Vcc than the power amplifier circuit 100 of the comparative example.

Exemplary embodiments of the present disclosure have been described. Each of the power amplifier circuit 10A and the power amplifier circuit 10B may be applied to, within an amplifier module having a two-stage configuration including a driver-stage amplifier and a power-stage amplifier, only the driver-stage amplifier, only the power-stage amplifier, or both the driver-stage amplifier and the power-stage amplifier. When each of the power amplifier circuit 10A and the power amplifier circuit 10B is applied to both the driver-stage amplifier and the power-stage amplifier, the effect of gain dispersion is enhanced compared to the case where each of the power amplifier circuit 10A and the power amplifier circuit 10B is applied to only the driver-stage amplifier or only the power-stage amplifier. Each of the power amplifier circuit 10A and the power amplifier circuit 10B may be applied to at least one amplifier in an amplifier module constituted by three or more stages of amplifiers.

As described in the first embodiment, the power amplifier circuit 10A includes a first transistor Q1 having a base supplied with an RF signal and a collector supplied with a variable power supply voltage Vcc corresponding to the level of the RF signal, the first transistor Q1 being configured to amplify the RF signal, a bias circuit 20 including a second transistor Q20 that supplies a first bias current I20 to the base of the first transistor Q1, and a bias adjustment circuit 40 that decreases a current to be supplied from the emitter of the second transistor Q20 as the variable power supply voltage Vcc decreases, thereby decreasing the bias current Ibias to be supplied to the base of the first transistor Q1. Accordingly, when the variable power supply voltage Vcc decreases, the current supplied from the emitter of the second transistor Q20 decreases. Then, the bias current Ibias to be supplied to the base of the first transistor Q1 decreases. Thus, the gain of the first transistor Q1 decreases. Accordingly, the gain dispersion of the power amplifier circuit 10A is broadened.

In the power amplifier circuit 10A, the bias adjustment circuit 40 may include the resistance element R40 having an end connected to the emitter of the second transistor Q20 and another end supplied with a voltage corresponding to the variable power supply voltage Vcc. This configuration can adjust the value of the first bias current I20.

The power amplifier circuit 10A may further include another bias circuit (the second bias circuit 30) including the third transistor Q30 that supplies another bias current (the second bias current I30) to the base of the first transistor Q1. This configuration can easily adjust the value of the bias current Ibias.

The embodiments described above are intended to help easily understand the present disclosure and are not to be used to construe the present disclosure in a limiting fashion. Elements included in the embodiments and the arrangements, materials, conditions, shapes, sizes, and so on thereof are not limited to those illustrated exemplarily but can be modified as appropriate. In addition, configurations given in different embodiments may be partially replaced or combined.

While embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A power amplifier circuit comprising:
a first transistor having a base supplied with a radio frequency (RF) signal and a collector supplied with a variable power supply voltage, wherein the variable power supply voltage corresponds to a level of the RF signal, and the first transistor is configured to amplify the RF signal;
a bias circuit including a second transistor configured to supply a first current from an emitter of the second transistor, the first current including a bias current portion supplied to the base of the first transistor and an adjusted current portion supplied to a bias adjustment circuit; and
the bias adjustment circuit configured to decrease the adjusted current portion as the variable power supply voltage decreases, thereby decreasing the bias current portion supplied to the base of the first transistor.

2. The power amplifier circuit according to claim 1, wherein the bias adjustment circuit comprises a resistance element having a first end connected to the emitter of the second transistor and a second end supplied with a voltage corresponding to the variable power supply voltage.

3. The power amplifier circuit according to claim 2, wherein the second end of the bias adjustment circuit is supplied with the voltage corresponding to the variable power supply voltage via a terminal of the power amplifier circuit.

4. The power amplifier circuit according to claim 2, wherein the voltage corresponding to the variable power supply voltage is equal to the variable power supply voltage.

5. The power amplifier circuit according to claim 2, wherein the second end of the bias adjustment circuit is connected to the collector of the first transistor.

6. The power amplifier circuit according to claim 1, further comprising a second bias circuit comprising a third transistor configured to supply a second bias current to the base of the first transistor.

7. The power amplifier circuit according to claim 2, further comprising a second bias circuit comprising a third transistor configured to supply a second bias current to the base of the first transistor.

8. A power amplifier circuit comprising:
a first transistor having a base supplied with a radio frequency (RF) signal and a collector supplied with a variable power supply voltage, wherein the variable power supply voltage corresponds to a level of the RF signal, and the first transistor is configured to amplify the RF signal;
a first bias circuit including a second transistor configured to supply a first bias current to the base of the first transistor from an emitter of the second transistor; and
a second bias circuit comprising a third transistor configured to supply a second bias current to the base of the first transistor from an emitter of the third transistor, wherein a voltage corresponding to the variable power supply voltage is supplied to a base of the second transistor.

* * * * *